United States Patent
Saric et al.

(10) Patent No.: US 10,439,555 B2
(45) Date of Patent: Oct. 8, 2019

(54) CHIRP GENERATOR

(71) Applicant: NXP B.V., Eindhoven (NL)

(72) Inventors: Tarik Saric, Eindhoven (NL); Juan Felipe Osorio Tamayo, Eindhoven (NL)

(73) Assignee: NXP B.V., Eindhoven (NL)

( * ) Notice: Subject to any disclaimer, the term of this patent is extended or adjusted under 35 U.S.C. 154(b) by 107 days.

(21) Appl. No.: 15/832,857

(22) Filed: Dec. 6, 2017

(65) Prior Publication Data

US 2018/0191302 A1    Jul. 5, 2018

(30) Foreign Application Priority Data

Dec. 29, 2016 (EP) .................................. 16207366

(51) Int. Cl.
*H03B 5/12* (2006.01)
*G01S 7/03* (2006.01)
(Continued)

(52) U.S. Cl.
CPC ............ *H03B 5/1243* (2013.01); *G01S 7/032* (2013.01); *G01S 7/35* (2013.01); *G01S 13/343* (2013.01);
(Continued)

(58) Field of Classification Search
CPC ..... H03L 7/099; H03L 7/197; H03L 2207/06; H03L 7/0991; H03L 7/107; H03L 7/1974;
(Continued)

(56) References Cited

U.S. PATENT DOCUMENTS 9,484,936 B2 * 11/2016 Waheed ................. H03L 7/099
2006/0208806 A1    9/2006 Chien
(Continued)

FOREIGN PATENT DOCUMENTS

EP            3107213 A1    12/2016

*Primary Examiner* — Ryan Johnson
(74) *Attorney, Agent, or Firm* — Rajeev Madnawat

(57) ABSTRACT

A chirp-generator comprising a phase-detector for providing a phase-difference-signal representative of a phase difference between a clock-input-signal and a feedback-signal. A VCO-circuit is configured to provide a chirp-generator-output-signal based on the phase-difference-signal. The VCO-circuit comprises a switched-varactor-bank, which includes a plurality of varactors, and a varactor-switch associated with each of the plurality of varactors. The varactor-switch is configured to selectively control whether or not the associated varactor contributes to the capacitance of the VCO-circuit, based on the state of a varactor-control-signal. The chirp-generator also includes a feedback-component configured to: receive the chirp-generator-output-signal; and apply a variable-multiplication-factor to the chirp-generator-output-signal in order to provide the feedback signal for the phase-detector. A controller provides a sequence of different variable-multiplication-factors to the feedback-component; and provides varactor-control-signals to the plurality of varactors such that the varactors are sequentially controlled such that they contribute to the capacitance of the VCO-circuit.

14 Claims, 5 Drawing Sheets

(51) Int. Cl.
     *H03C 3/09*    (2006.01)
     *G01S 7/35*    (2006.01)
     *G01S 13/34*   (2006.01)
     *H03L 7/099*   (2006.01)
     *H03L 7/197*   (2006.01)

(52) U.S. Cl.
     CPC ......... *H03B 5/1212* (2013.01); *H03B 5/1262* (2013.01); *H03B 5/1265* (2013.01); *H03C 3/0925* (2013.01); *H03C 3/0941* (2013.01); *H03C 3/0958* (2013.01); *H03L 7/099* (2013.01); *H03L 7/197* (2013.01); *H03L 2207/06* (2013.01)

(58) Field of Classification Search
     CPC .. H03C 3/0941; H03C 3/0925; H03C 3/0958; H03C 3/0991; H03B 5/1243; H03B 2200/005; H03B 23/00; H03B 5/1212; H03B 5/1215; H03B 5/126; G01S 13/343; G01S 13/931; G01S 7/032; G01S 13/02; G01S 7/35; G01S 7/4008; G01S 13/345
     See application file for complete search history.

(56) References Cited

U.S. PATENT DOCUMENTS

| | | | |
|---|---|---|---|
| 2008/0136544 A1 | 6/2008 | Tang | |
| 2011/0298506 A1* | 12/2011 | Salle | ....................... G01S 7/032 327/156 |
| 2018/0175868 A1* | 6/2018 | Stuhlberger | .............. G01S 7/35 |

\* cited by examiner

* n = number of varactors

CHIRP GENERATOR

CROSS-REFERENCE TO RELATED APPLICATIONS

This application claims the priority under 35 U.S.C. § 119 of European patent application no. 16207366.2, filed Dec. 29, 2016 the contents of which are incorporated by reference herein.

The present disclosure relates to chirp generators, and in particular, although not exclusively, to chirp generators that include a phase locked loop for use in radar applications.

According to a first aspect of the present disclosure there is provided a chirp-generator comprising:
  a phase-detector configured to:
    receive a clock-input-signal;
    receive a feedback-signal; and
    provide a phase-difference-signal representative of a phase difference between the clock-input-signal and the feedback-signal;
  a voltage-controlled-oscillator that includes a VCO-circuit, wherein the VCO-circuit is configured to provide a chirp-generator-output-signal based on the phase-difference-signal, where the VCO-circuit comprises:
    a switched-varactor-bank, which includes:
      a plurality of varactors, and
      a varactor-bias-switch associated with each of the plurality of varactors, wherein the varactor-switch is configured to selectively control whether or not the associated varactor contributes to the capacitance of the VCO-circuit, based on the state of a varactor-control-signal;
  a feedback-component configured to:
    receive the chirp-generator-output-signal; and
    apply a variable-division-factor to the chirp-generator-output-signal in order to provide the feedback signal for the phase-detector;
  a controller configured to:
    provide a sequence of different variable-division-factors to the feedback-component; and
    provide varactor-control-signals to the plurality of varactors such that the varactors are sequentially controlled such that they contribute to the capacitance of the VCO-circuit.

Use of such a switched-varactor-bank can enable a lower effective VCO-gain-factor to be used to provide a chirp-generator-output-signal with a given bandwidth. In this way, phase noise in the output-signal can be improved.

In one or more embodiments the phase-detector, the voltage-controlled-oscillator, and the feedback-component comprise a phase-locked-loop, which has a PLL-bandwidth. The rate of change of the capacitance of the switched-varactor-bank, when it is controlled to contribute to the capacitance of the VCO-circuit, may be slower than the PLL-bandwidth.

In one or more embodiments the sequence of different variable-division-factors comprises a set of values that increase or decrease linearly over time.

In one or more embodiments the varactor-control-signals are configured to sequentially control the plurality of varactors such that each one contributes to the capacitance of the VCO-circuit in turn, optionally at moments in time that are evenly spaced apart during a chirp in the chirp-generator-output-signal. This can enable an implementation that allows the varactor-control-signals to be programmed for optimal chirp performance. The timing of varactor switching can be flexible, programmable in a timing engine and can be related to chirp signal.

In one or more embodiments the switched-varactor-bank further comprises a varactor-biasing-circuit associated with each of the plurality of varactors. Each varactor-biasing-circuit may comprise a bias-voltage-connection for providing a bias voltage to the associated varactor; a chirp-bias-current-source; a chirp-reset-current-source; a varactor-chirp-switch configured to selectively connect the chirp-bias-current-source to the bias-voltage-connection; and a varactor-reset-switch configured to selectively connect the chirp-reset-current-source to the bias-voltage-connection. Based on the state of the varactor-control-signal, the varactor-biasing-circuit may be configured to: close the varactor-chirp-switch (during a chirp) and open the varactor-reset-switch (during a chirp reset) in order for the associated varactor to contribute to the capacitance of the VCO-circuit; and open the varactor-chirp-switch and close the varactor-reset-switch in order for the associated varactor not to contribute to the capacitance of the VCO-circuit.

In one or more embodiments the magnitude of the chirp-reset-current-source is greater than that of the chirp-bias-current-source.

In one or more embodiments each varactor-biasing-circuit further comprises a low-pass filter that is connected between the bias-voltage-connection ground.

In one or more embodiments the voltage-controlled-oscillator further comprises: a switched-coarse-bank that includes a plurality of capacitors that are either included in or excluded from the VCO-circuit based on a received coarse-control-signal. The coarse-control-signal may be a static signal during use, which may be configured to set the capacitance level of the switched-coarse-bank.

In one or more embodiments each of the plurality of varactors comprises a pair of varactors, and the VCO circuit may be a differential circuit. The voltage-controlled-oscillator may comprise a positive-VCO-output-terminal and a negative-VCO-output-terminal, either of which may be configured to provide the chirp-generator-output-signal. The switched-varactor-bank may be connected between the positive-VCO-output-terminal and the negative-VCO-output-terminal.

In one or more embodiments the feedback-component is configured to apply an integer or fractional variable-division-factor to the chirp-generator-output-signal in order to provide the feedback signal for the phase-detector.

There may be provided a method of operating a chirp-generator, the method comprising:
  receiving a clock-input-signal,
  receiving a feedback-signal;
  providing a phase-difference-signal representative of a phase difference between the clock-input-signal and the feedback-signal;
  providing a chirp-generator-output-signal based on the phase-difference-signal;
  selectively controlling whether or not one or more of a plurality of varactors in a switched-varactor-bank contributes to the capacitance of a VCO-circuit;
  applying a sequence of different variable-division-factor to the chirp-generator-output-signal in order to provide the feedback signal for the phase-detector; and
  providing varactor-control-signals to the plurality of varactors such that the varactors are sequentially controlled such that they contribute to the capacitance of the VCO-circuit.

There may be provided an automobile system comprising any chirp-generator disclosed herein. The automobile system may comprise a radar system.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

Chipsets that can operate in the 76-77 GHz frequency range (ISM band) can be used as radar systems for cruise control (for example in adaptive cruise control systems) and for anti-collision control in the automotive industry. Also 77-81 GHz can be used, especially for a large chirp amplitude for a short range application.

Figure 1:
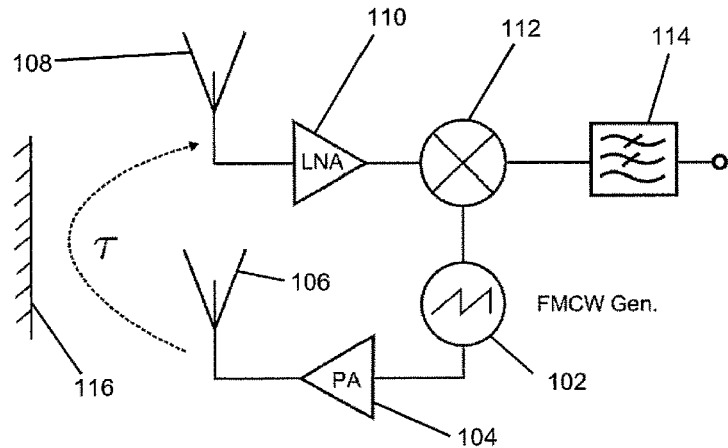
FIG. 1 shows an example FMCW (frequency modulated continuous wave) radar system.

FIG. 1 shows a FMCW (frequency modulated continuous wave) radar system that uses a single PA (power amplifier) 104 and a single LNA 110 (low noise amplifier), although multiple PAs and/or LNAs can also be used.

The system includes a FMCW generator 102, which may also be referred to as a chirp-generator, that feeds the PA 104. The FMCW signal is amplified by the PA 104 and then transmitted by a transmitting-antenna 106. The signal that is transmitted by the transmitting-antenna 106 is reflected by an object 116 in front of the radar, and then the reflected signal is received by a receiving-antenna 108. The receiving-antenna 108 is connected to the LNA 110 such that the LNA 110 amplifies the received reflected signal.

The output of the LNA 110 and also the FMCW generator 102 are connected to a mixer 112 such that the reflected signals are down converted using the same FMCW signal that was transmitted by the transmitting-antenna 106. The reflected signal is shown as experiencing a time delay r as it travels to and from the object 116. Therefore, as the reflected signal is mixed with the FMCW signal, the mixer 112 produces a low frequency mixer-output-signal that has a frequency that is proportional to the distance to the object 116. In this example, the mixer-output-signal is low-pass filtered by a low-pass-filter 114 in order to remove any high frequency noise.

Figure 2A:
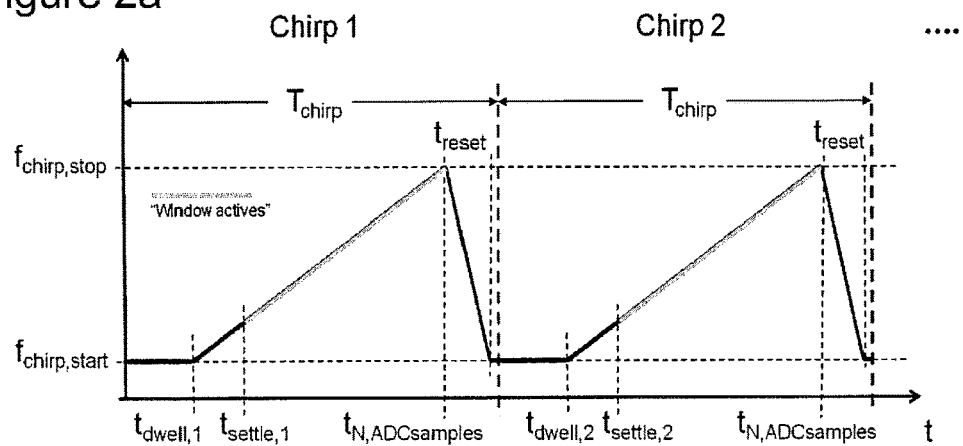
FIGS. 2a and 2b show an example FMCW signal that can be generated by the FMCW-generator of FIG. 1.
Figure 2B:
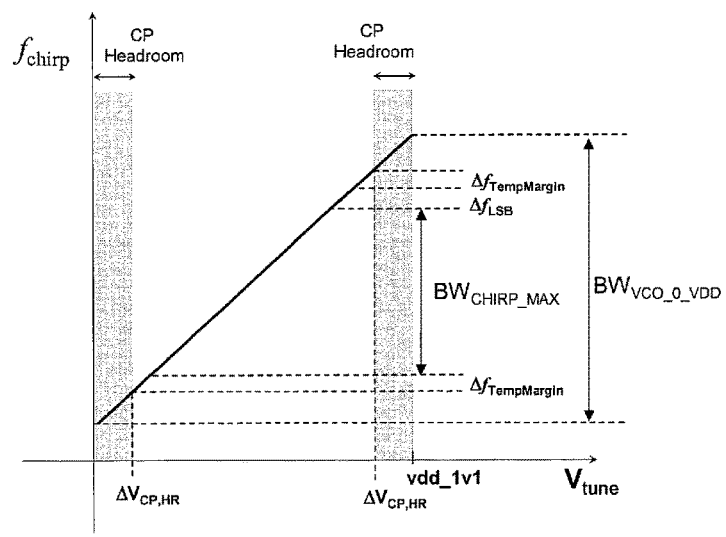

FIGS. 2a and 2b show an example FMCW signal that can be generated by the FMCW-generator of FIG. 1. FIG. 2a shows two complete chirps. Frequency is shown on the vertical axis, and time is shown on the horizontal axis. From a PLL perspective, one chirp can be limited by the VCO gain (Kvco [GHz/V]) and the PLL power supply. This limitation is shown in FIG. 2. Increasing VCO gain (Kvco) can resolve the power supply limitation, at the expense of increased phase noise. FIG. 2b shows the rising portion of a single chirp.

The period of the signal in FIG. 2 is $T_{chirp}$, and its bandwidth is shown in FIG. 2b as $BW_{CHIRP\_MAX}$, which is this is an effective chirp bandwidth that will be used to determine distance. In these systems, the resolution of the detected distance to an object is related to $BW_{chirp}$ as:

$$dr = \frac{c}{2 \ BW_{chirp}}, \qquad (1)$$

where c is the speed of light. The term "chirp amplitude" can also be used instead of "chirp bandwidth", especially where the chirps are illustrated as a saw-tooth signal.

This equation makes it clear that radar systems that are for detecting close objects, such as those used for parking systems in automobiles, require a FMCW signal with chirps that are swept over a large bandwidth, for example with a chirp-bandwidth that is larger than 1 GHz. For parking applications, chirps having a bandwidth as large as 4 GHz may be desired. However, for different applications, different chirp bandwidths are required. Typically, larger chirp bandwidths will result in better resolution, as illustrated by equation to (1) above. LRR (Long Range Radar) can be used for large distance detections (100 m). MRR (Mid Range Radar) and SRR (Short Range Radar) can be used for side-detections and parking. An SRR bandwidth of 4 GHz corresponds to a distance resolution of the order of centimeters.

FIG. 2a illustrates that the FMCW signal is a repetitive signal comprising a plurality of chirps. Each period of the signal contains a dwell time ($t_{dwell}$) before the frequency of the FMCW signal starts increasing. The first portion of the increasing frequency is a settle time ($t_{settle}$), which is followed by the ramp-up region of the chirp. This ramp-up region is the portion that can be used to extract information about distance to an object, and also speed and acceleration of an object in some examples. At the end of the ramp-up time, the frequency returns to its starting level ($f_{chirp,start}$) at a reset time ($t_{reset}$) over a reset period.

Figure 3A:
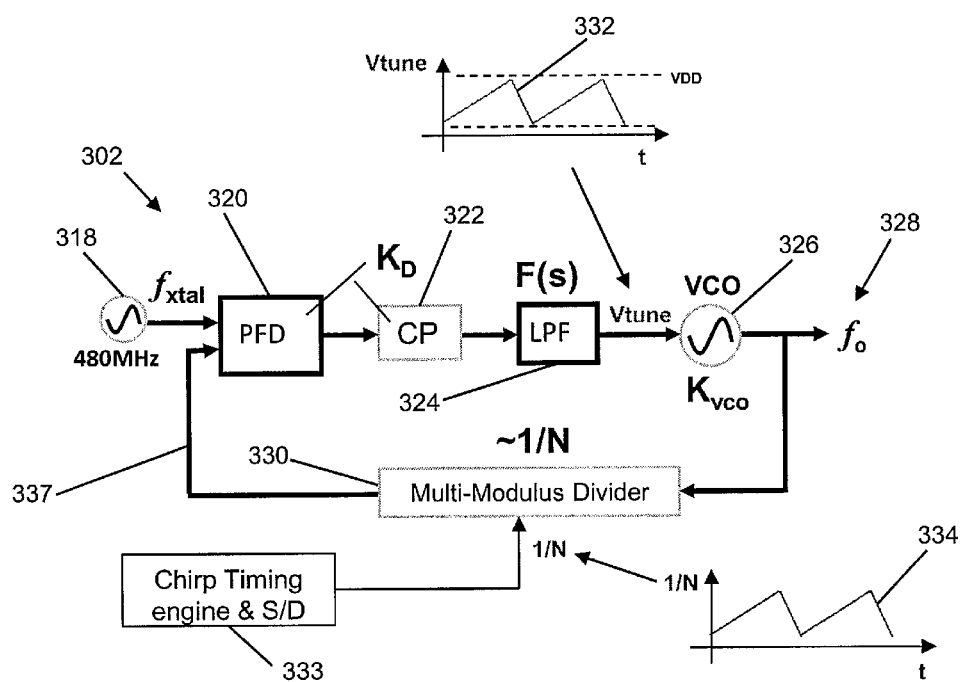
FIG. 3a shows a simplified block diagram of an example implementation of a chirp-generator.

FIG. 3a shows a simplified block diagram of an example implementation of a chirp-generator 302, for example that can be used in the radar system of FIG. 1 to generate signals such as those shown in FIG. 2a. The chirp-generator 302 uses a phase locked loop (PLL) as will be discussed below.

The chirp-generator 302 of FIG. 3 includes a clock 318, which can be implemented as a crystal oscillator. The clock 318 provides a clock-input-signal (fxtal), in this example with a frequency of 480 MHz. The output signal (fo) 328 of the chirp-generator is equal to fxtal*N, where N is division factor obtained by multi-modulus divider 330. The chirp-generator 302 also includes a phase-detector 320. The phase-detector 320 has a first-input-terminal that receives the clock-input-signal from the clock 318, and also has a second-input-terminal that receives a feedback-signal. The feedback-signal is equal to the output signal (fo), divided by the division factor N. Further details of how the feedback-signal is generated will be provided below. The phase-detector 320 compares the phase of the two signals received at its input terminals and provides a phase-difference-signal at an output-terminal. The phase-difference-signal is representative of the phase difference between the clock-input-signal and the feedback-signal.

Also shown in FIG. 3a, is the equivalent gain of the charge-pump circuit $K_D$, which equals charge pump current (Icp) divided by $2\pi$.

In this example, the phase-difference-signal that is generated by the phase-detector 320 is processed by a charge-pump (CP) 322. The charge-pump is the circuit (current sources) that either pumps charge (current) to a low-pass filter 324, or removes charge from the low-pass filter 324. In this way, the phase error signal is translated to charge, where depending on the phase difference, either more or less charge will be injected. When the PLL is in lock, ideally, the charge-pump 322 will not inject any charge into the low-pass filter 324. However, if chirp signal is created, constant phase difference will be detected in phase-detector 320. This will result in charge injection and rising voltage Vtune. The output of the CP block 322 is then low-pass filtered by the low-pass filter 324 in order to remove any high frequency noise. Also the low-pass filter position of poles and zeros are set so as to provide a desired proper phase margin of the PLL. The output signal of the low-pass filter 324 is identified as Vtune 332 in FIG. 3, and can be referred to as a filtered-phase-difference-signal (which is derived from the phase-difference-signal). The Vtune signal 332 is provided as an input signal to a voltage controlled oscillator (VCO) 326, with frequency gain Kvco [Hz/V]. The VCO 326 provides an output-signal ($f_O$) 328 of the chirp-generator 302. The output-signals ($f_O$) disclosed herein may also be referred to as chirp-generator-output-signals. As can be seen, the Vtune signal 332 is controlled by the phase locked loop such that it has the desired profile of the chirp (FMCW) signal that is to be output by the chirp-generator 302.

The chirp-generator 302 also includes a feedback-component, which in this example is the multi-modulus divider 330. The multi-modulus divider 330 has a first-input-terminal that is configured to receive the output-signal ($f_O$) 328. The multi-modulus divider 330 applies a variable-division-factor (which can also be referred to as a variable-multiplication-factor, depending on its value) to the output-signal ($f_O$) 328 in order to provide the feedback signal 337 for the phase-detector 320. The multi-modulus divider 330 can be either an integer N divider, or a fractional divider, optionally with sigma delta to reduce in-band switching noise.

FIG. 3a also shows a controller 333, which in this example includes a chirp timing engine and sigma-delta dithering. The controller 333 provides a divider-control-signal (1/N) to a control-input-terminal of the multi-modulus divider 330, such that the multi-modulus divider 330 can set the variable-division-factor that is to be applied to the output-signal ($f_O$) 328 based on the divider-control-signal (1/N). The divider-control-signal (1/N) provides a sequence of different variable-division-factors to the multi-modulus divider 330 over time. The sequence includes a set of values that increase linearly over time in order to define the ramp-up region of the output-signal ($f_O$) 328, which will be used to determine the distance to an object. (Although it will be appreciated that in other examples the sequence can include values that decrease linearly over time in order to define a ramp-down region of the output-signal ($f_O$) 328 for determining the distance to an object.) At the end of the sequence, the sequence is repeated from its initial value. In this way, the controller 333 provides chirp timing information to the PLL.

The controller 333 also provides sigma delta dithering, which is a digital function that can be considered as dithering the division signal. This can be useful for a fractional-N PLL, where a frequency resolution is below that of the reference frequency is obtained (fxtal). If N is an integer, the output signal fo=fxtal*N. If N includes an integer part ($N_{int}$) and a fractional part ($N_{frac}$) that is dithered by sigma delta, then the output frequency is equal to fo=fxtal*($N_{int}$+1/$N_{frac}$). This N frac part is provided by the sigma delta, where the signal is changing in range of +4, −3 (depending on sigma delta order). On average, a frequency step is obtained that is smaller than reference frequency (fxtal)

For an example integer PLL:—

$fo$=480 MHz*50($N$=50)=24 GHz $fo$=480 MHz*52($N$=51)=24,480 GHz

For an example fractional N PLL:

$fo$=480*(50+1/5)($N_{int}$=50,$N_{frac}$=5)=24,096 GHz

Therefore, a step size of less than 480 MHz can be achieved by the fractional N PLL.

An example of the divider-control-signal (1/N), which has the desired profile of the chirp (FMCW) signal that is to be output by the chirp-generator 302, is shown graphically with reference 334. It will be appreciated that setting the divider-control-signal (1/N) in the way shown causes the constant phase-difference-signal, resulting in increasing tune voltage (Vtune 332) that has a similar profile to the divider-control-signal, which in turn causes the output-signal ($f_O$ 328) to have the desired profile.

It is possible to increase the chirp bandwidth of the chirp-generator 302 by increasing the VCO-gain-factor ($K_{VCO}$). However, higher values of the VCO-gain-factor ($K_{VCO}$) will result in larger phase noise, since the filter noise will be also be multiplied by this higher gain-factor. In general, a higher Kvco means that voltage is multiplied with a higher gain. If the voltage includes (i) a desired voltage, plus (ii) undesired noise, then the undesired noise voltage will also be multiplied by the same Kvco gain. This can degrade phase noise.

In this way, a phase locked loop (PLL) system, which is a closed loop system, can be used to generate the FMCW/chirp signal. With PLL systems, error analysis can be used to determine a bandwidth that is required to guarantee a certain frequency error of the control system. Since the reset period ($t_{reset}$) of FIG. 2a is the most demanding in terms of speed and steepness, this region will determine the PLL loop bandwidth (in order to prevent cycle slip).

In general, the phase noise of a PLL is important. Due to filtering in the receiver, the most dominant phase noise of a PLL is considered around 1 MHz. In many examples, the phase noise at this frequency is dominated by the VCO 326 of the PLL. However, systems that provide a large chirp bandwidth ($BW_{chirp}$), will require an increase in PLL bandwidth (assuming that the ramp-up time is the same), which will result in the phase noise being degraded.

Figure 3B:
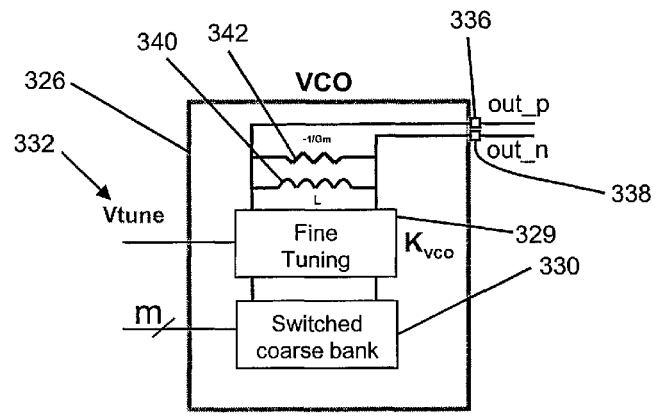
FIG. 3b shows an example implementation of the VCO 326 of FIG. 3a as a block diagram.
Figure 3C:
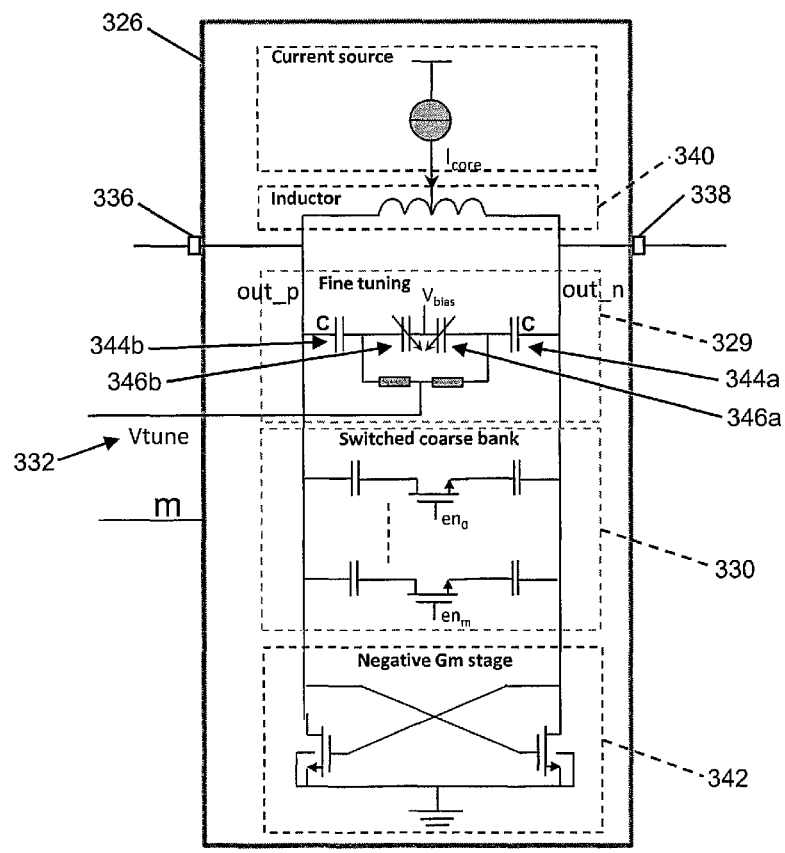
FIG. 3c shows more detail of the VCO of FIG. 3b as a schematic diagram.

FIG. 3b shows an example of a differential implementation of the LC Voltage Controlled Oscillator (VCO) 326 as a block diagram, and FIG. 3c shows more detail of the same VCO as a schematic diagram. The VCO 326 has a VCO-circuit that includes a fine-tuning-block 329, a switched-coarse-bank 330, a negative-Gm-stage 342 and an inductor 340. Each of these blocks/components is connected in parallel with each other between a positive-VCO-output-terminal 336 and a negative-VCO-output-terminal 338. Either of the positive-VCO-output-terminal 336 and the negative-VCO-output-terminal 338 can be used to provide the output-signal ($f_O$) 328 because they both contain the same frequency information. A differential circuit implementation circuit can have a good sensitivity to supply variations. In other examples a single ended circuit can be used instead of the differential circuit of FIG. 3b. Generally, the VCO 326 can be considered as having a VCO tank, which can be single ended or differential.

The Vtune signal 332 is provided as an input signal to the fine-tuning-block 329. As will be discussed below with reference to FIG. 3c, the level of the Vtune signal 332 affects the frequency of the output signals (provided at terminals 336 and 338).

The switched-coarse-bank 330 includes a plurality of capacitors that are either included in or excluded from the VCO-circuit based on a received coarse-control-signal (m). The coarse-control-signal is a static signal during use that sets the capacitance level of the switched-coarse-bank 330 such that the fine-tuning-block 329 can operate in the desired manner.

The vco frequency equation is:

$$f_{vco}=1/(2*\pi(\text{sqrt}(LC))$$

Where the value of C is set in accordance with the received coarse-control-signal (m). This means that frequency will decrease if C is increased.

Turning now to FIG. 3c, the fine-tuning-block 329 in this example includes two fine-tuning-varactors 346a, 346b and two constant metal capacitors 344a, 344b. The Vtune signal 332 is received by the fine-tuning-block 329. A varactor can be considered as a variable capacitor, where variation is made by voltage. Simplistic equations is: Cvar=C0+Vtune*Clope. Normally, a Tangens Hyperbolicus (tan h) function is used to model the varactor. Cvar=C0+C1*tan h((Vtune−a)/b). Where are a and b are constants, that have values that depend on the process that is being used.

It will be appreciated that other components that are also connected to the VCO tank will affect the frequency response of the fine-tuning-block 329. In this example, one or more additional capacitors in the switched-coarse-bank 330 can also be selectively connected bin the VCO tank, in accordance with the received coarse-control-signal (m). The coarse-control-signal (m) includes a value for each capacitor (in this example pair of capacitors) in the switched-coarse-bank 330 that is used to control an associated switch to either include or exclude the associated capacitor in the VCO-circuit. If a capacitor is included in the VCO-circuit, then the total tank capacitance will change with resulting VCO frequency change.

The negative-Gm-stage 342 is used to ensure oscillation and compensate for losses in the VCO tank.

Figure 4A:
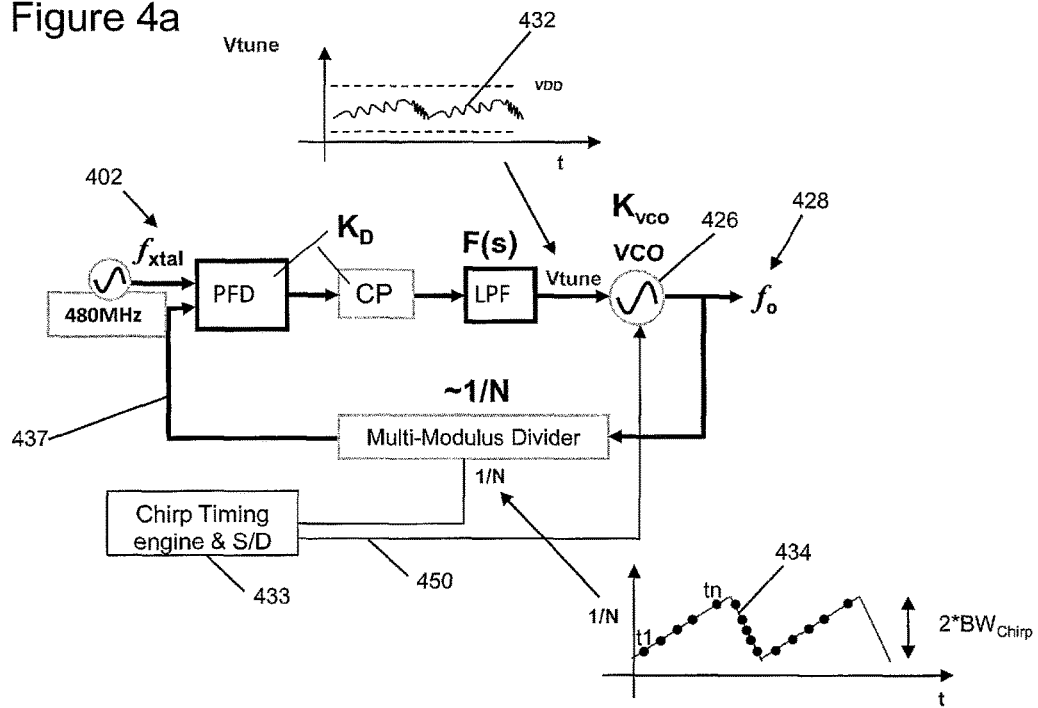
FIG. 4a shows a simplified block diagram of an example embodiment of a chirp-generator.
Figure 4B:
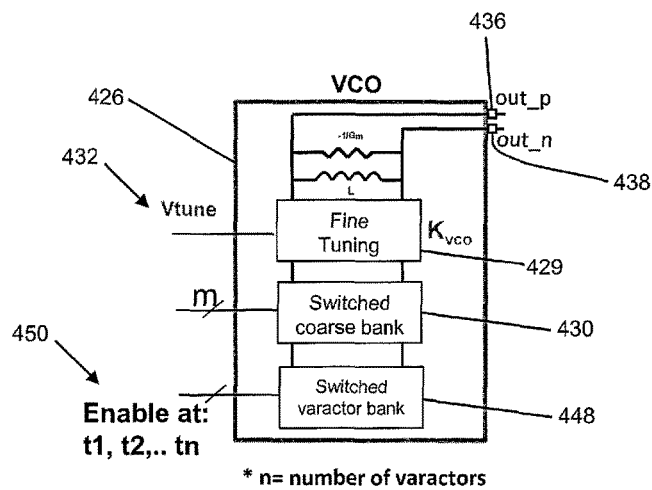
FIG. 4b shows an example embodiment of a VCO that includes a switched-varactor-bank.
Figure 4C:
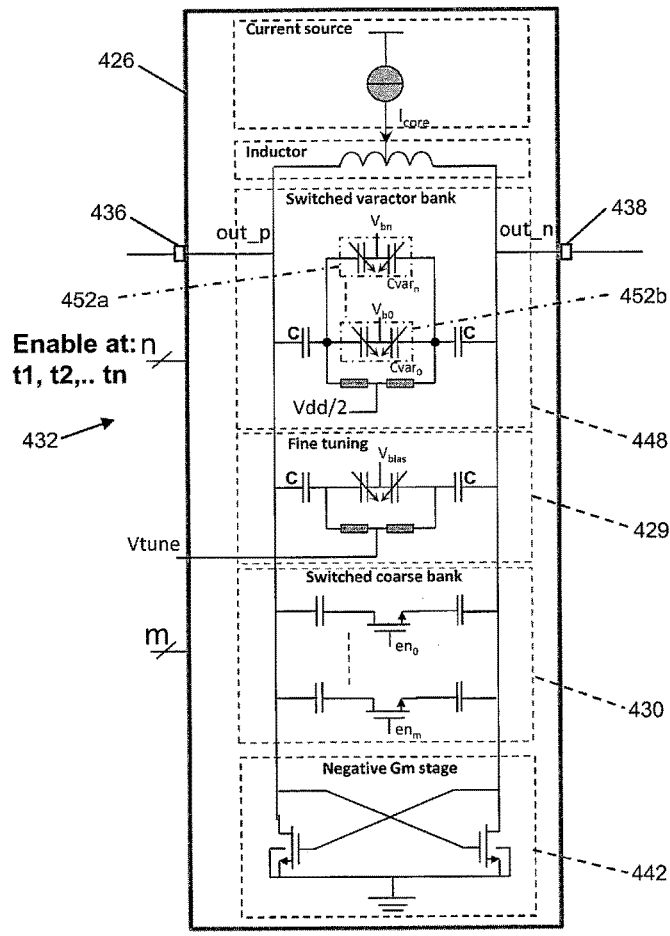
FIG. 4c shows more detail of the VCO of FIG. 4b.
Figure 4D:
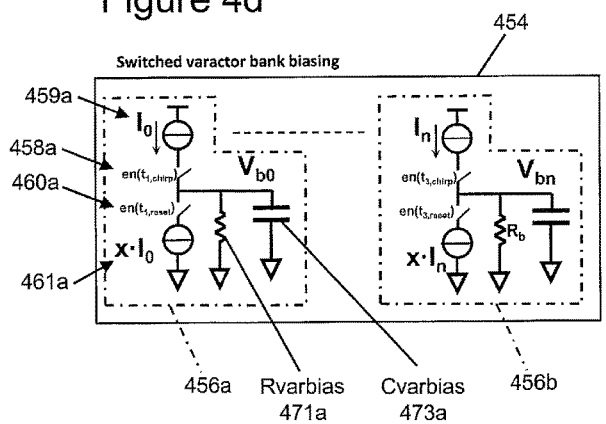
FIG. 4d shows an example embodiment of a switched-varactor-bank-biasing-circuit for each of the varactors in the switched-varactor-bank of FIG. 4c.
Figure 4E:
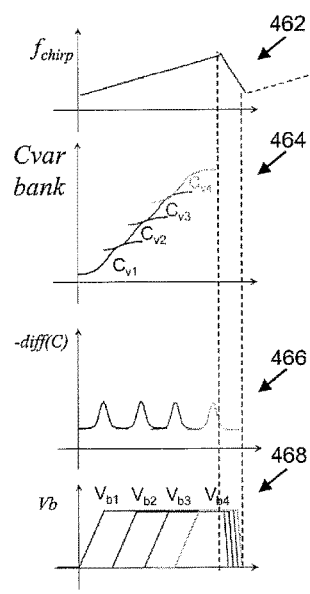
FIG. 4e shows example waveforms for a chirp-generator circuit that includes the VCO of FIG. 4b, and the switched-varactor-bank 448 of FIGS. 4c and 4d.

FIG. 4a shows a simplified block diagram of an example embodiment of a chirp-generator 402. FIGS. 4b to 4d illustrate further details of the VCO 426 that is used in the chirp-generator 402 of FIG. 4a. FIG. 4e shows example waveforms of signals in the chirp-generator. Features of FIG. 4 that have already been described with reference to FIG. 3 have been given corresponding reference numbers in the 400 series, and will not necessarily be described again here.

As will be discussed in detail below, in this example embodiment the VCO 426 includes a switched-varactor-bank that can be used to selectively control to what extent the switched-varactor-bank contributes to the capacitance of the VCO-circuit, during use. During chirp generation, when the varactor bank in the VCO is switched on, the PLL voltage can decrease, whereas it would otherwise increase, with an increasing division factor. In this way, the PLL can provide an output signal 428 that has a higher bandwidth than the VCO of FIGS. 3b and 3c, without requiring an increase in the VCO-gain-factor ($K_{VCO}$). In this way, a frequency increase is introduced in the VCO 426 during the chirp. Advantageously, a frequency increase is introduced at a rate that is less than the PLL bandwidth. The PLL bandwidth can be considered as the response speed of the PLL system. This is controlled by the loop filter parameters, charge pump gain and VCO gain ($K_{VCO}$). For example, suppose that the division factor is changed from 50 to 51. How fast the frequency settles from 24 GHz to 24,480 GHz depends on the PLL bandwidth. If the varactor change is faster than the PLL can cope with, it will take long time for the PLL to settle. Because of this, it can be beneficial for any capacitor (varactor) change to be relatively slower than the PLL bandwidth.

The chirp-generator 402 of FIG. 4a is similar to the chirp-generator of FIG. 3a. In FIG. 4a, the VCO 426 is different in that it includes a switched-varactor-bank that comprises n varactors, as will be described with reference to FIGS. 4b to 4d below.

Also, in FIG. 4a, the controller 433 provides a varactor-control-signal 450 to each of the varactors in the VCO 426. In this way, the capacitances of the VCO 426 are changed during use such that the bandwidth of the output-signal ($f_O$) 428 is extended. In FIG. 4a, the instances in time at which a varactor is included in or excluded from the VCO-circuit are marked with solid circles on the divider-control-signal (1/N) 434. At these instances in time, the state of the varactor-control-signal 450 changes. When the varactor-control-signal 450 changes, the VCO 426 frequency will increase and will react in a different way to the received Vtune signal 432. Due to the feedback in the PLL circuit, this in turn causes the Vtune signal 432 to be set lower in order to bring the phase of the output-signal ($f_O$) 428 closer to the received clock signal. The Vtune signal 432 is shown graphically in FIG. 4a, and it can be seen that the Vtune signal 432 initially starts to decrease each time a new varactor is included in the VCO-circuit (when it was otherwise increasing), and vice versa.

Significantly, Kvco 426 has not needed to be increased to provide the output-signal ($f_O$) with a larger chirp-bandwidth. Therefore, advantageously, the switched-varactor-bank 448 can enable a lower effective VCO-gain-factor ($K_{VCO}$) to be used to provide an output-signal ($f_O$) with a given bandwidth. In this way, phase noise in the output-signal ($f_O$) can be improved.

FIG. 4b shows, at a high level, how the switched-varactor-bank 448 can be incorporated into the VCO 426. The switched-varactor-bank 448 is connected to the VCO tank. FIG. 4b also shows that the varactor-control-signal 450 is received by the switched-varactor-bank 448, and that the varactor-control-signal 450 is used to enable/include each of the n varactors in turn at instances in time: t1, t2, . . . tn.

The controller 433 is used to align the timing between the chirp and varactor-enable-signals that are provided by the varactor-control-signal 450. For a switched-varactor-bank 448 that includes n varactors, the chirp ramp-up time can be divided by n in order to obtain the values of t1 to tn, at which times the varactors will be enabled/included in the VCO-circuit. In this way, the plurality of varactors are controlled such that each one starts contributing to the capacitance of the VCO-circuit in turn, at moments in time that are evenly spaced apart during a (ramp-up period) chirp. The capacitance levels of the varactors follow a tan h(x) function, such that advantageously the frequency of the output-signal ($f_O$) 428 will not change abruptly. This is important because the PLL should stay in lock during the transitions as varactors are enabled. If the capacitance levels changed too quickly, then the PLL may fall out of lock. Because of that enable signal are delayed (filtered) as shown in FIG. 4d.

FIG. 4c shows more detail of the VCO 426 of FIG. 4b. In addition to the components of FIG. 3c, which will not necessarily be described again here, the switched-varactor-bank 448 is shown in more detail. The switched-varactor-bank 448 includes a plurality of varactors, which in this example are provided as pairs of varactors 452a, 452b. Each pair of varactors 452a, 452b receives a varactor-bias-voltage ($V_{b0}$–$V_{bn}$) from an associated varactor-biasing-circuit, which will be described with reference to FIG. 4d.

FIG. 4d shows an example of a switched-varactor-bank-biasing-circuit 454, which includes a varactor-biasing-circuit 456a, 456b for each of the pairs of varactors in the switched-varactor-bank of FIG. 4c. In this example only two varactor-biasing-circuits 456a, 456b are shown. However, if there are 10 varactor pairs, then 10 varactor-biasing-circuits would be needed (456a, 456b, 456c . . . to 456j, for example). Each varactor-biasing-circuit 456a, 456b includes a varactor-switch (which may also be referred to as a varactor-bias-switch) that is associated with each of the plurality of varactors. In this example, each varactor-biasing-circuit 456a, 456b includes a pair of switches: a varactor-chirp-switch 458a and a varactor-reset-switch 460a. These switches are controlled by the varactor-control-signal 450 such that they have opposite states to each other: when a varactor is to be included in the VCO-circuit (such that it significantly contributes to the capacitance of the switched-varactor-bank 448), the associated varactor-chirp-switch 458a is closed and the associated varactor-reset-switch 460a is open; when a varactor is to be excluded from the VCO-circuit (such that it does not significantly contribute to the capacitance of the switched-varactor-bank 448), the associated varactor-chirp-switch 458a is open and the associated varactor-reset-switch 460a is closed. In this way, the varactor-switches selectively control whether or not (or to what extent) the associated varactor contributes to the capacitance of the VCO-circuit, based on the state of a varactor-control-signal.

In the example of FIG. 4d, the bias voltages are created by current sources that are selectively connected to a bias-voltage-connection ($V_{b0}$–$V_{bn}$) of the switched-varactor-bank 448. When a varactor-chirp-switch 458a is closed, it connects a chirp-bias-current-source 459a to the bias-voltage-connection ($Vb_0$). When the varactor-chirp-switch 458a is open, it disconnects the chirp-bias-current-source 459a from the bias-voltage-connection ($Vb_0$). When a varactor-reset-switch 460a is closed, it connects a chirp-reset-current-source 461a to the bias-voltage-connection ($Vb_0$). When the varactor-reset-switch 461a is open, it disconnects the chirp-reset-current-source 461a from the bias-voltage-connection ($Vb_0$). The chirp-bias-current-source 459a has an opposite polarity to the chirp-reset-current-source 461a, with reference to the bias-voltage-connection ($Vb_0$). In this example, the magnitude of the chirp-reset-current-source 461a is greater than that of the chirp-bias-current-source 459a, such that the bias voltage falls more quickly during a reset than it rises during a ramp-up of the chirp.

As will be discussed below, FIG. 4e represents the frequency chirp 462 with corresponding switch-varactor-bank capacitances (and it's derivative) and varactor biasing.

A bias voltage linearly increases when the chirp-bias-current-source 459a is connected to the bias-voltage-connection ($Vb_0$), as shown in FIG. 4e, 468, where each bias point Vb is turned on during the chirp and turned off during reset. This causes the capacitance of each varactor to increase smoothly 464 (Cvarbank), such that the desired frequency offset in the PLL will be created. The overall gain of the switched-varactor-bank represented as derivative diff (C) of switched-varactor-bank cell 466 is averaged with the number of the varactors. This will result in lower gain and improved phase noise.

The varactor-biasing-circuits 456a, 456b also each include a low-pass filter, which is implemented as a resistor 471a (Rvarbias) and capacitor 473a (Cvarbias) that are in parallel with each other between the (i) bias-voltage-connection ($Vb_0$); and (ii) ground. Suppose the varactor-chirp-switch 458a is closed, current will flow into resistor and Vbo will be equal to Io*Rvarbias. The R and C combination form a low pass filter, and an increase in Vbo once the varactor-chirp-switch 458a is on will be slowed down by C.

In an example where 4 GHz will be provided by one varactor, the varactor gain should be at least 4 GHz/V. In one or more of the embodiments disclosed herein, it can be advantageous to keep a main varactor (in the fine-tuning-block 429) small, with a gain of 1 GHz/V, and to switch other varactor bank components during the chirp. For example, if the switched-varactor-bank is to provide the remaining 3 GHz, if 10 switched varactors are used, then 300 MHz will be provided by each varactor. During a chirp, the overall gain will be 1 GHz plus 300 MHz/V form the switched-varactor-bank. As the chirp ramp-up time progresses, one of the switched varactors will settle to a low gain, and then another switched varactor (having a peaking gain of 300 MHz/V) will be activated. Therefore, the overall gain is averaged to 1 GHz/V, plus the average value of the of 300 MHz peaking varactors. This is shown in FIG. 4e 464, 466, with capacitor as example.

During a reset, after the chirp has reached its maximum frequency value, the varactor-reset-switches 460a are enabled in sequence in order to reduce the bias voltages and control the associated varactors such that they do not significantly contribute to the capacitance of the VCO-circuit. The bias voltages can advantageously be reduced faster than they were increased, in order to provide a reset time that is shorter than the chirp ramp-up time. This difference in chirp and reset time can be also controlled by the low pass filter that is provided in each varactor-biasing-circuit by the resistor 471a (Rvarbias) and capacitor 473a (Cvarbias).

FIG. 4e shows example waveforms for a chirp-generator circuit that includes the VCO 402 of FIG. 4b, and the switched-varactor-bank 448 of FIGS. 4c and 4d. In this illustration, the switched-varactor-bank 448 includes four varactors. In each of the waveforms, time is shown on the horizontal axis.

The first waveform 462 in FIG. 4e shows the frequency of the output-signal ($f_O$) of the chirp-generator as $f_{chirp}$.

The second waveform 464 shows the capacitance of the switched-varactor-bank 448 that is included in the VCO-circuit, and how the capacitance varies over the ramp-up of the chirp as additional varactors are included in the VCO-circuit. The contribution to the overall capacitance by each varactor is shown separately as $C_{v1}$, $C_{v2}$, $C_{v3}$, $C_{v4}$ as it is included in the VCO-circuit in line with the changing varactor-control-signal 450. Due the nature of varactors, and the fact that a plurality of them are included sequentially in turn, overall the capacitance, and therefore the corresponding frequency, of the switched-varactor-bank 448 increases relatively slowly, and in this example slowly enough such that the feedback loop of the PLL circuit can stay in lock and the frequency of the output-signal ($f_O$) 462 is not significantly affected in an undesirable way.

The third waveform 466 shows the derivative of capacitance in time. Since the capacitance of each varactor is a tan h function, it will peak at the middle of the tan h curve.

The fourth waveform 468 shows the bias voltage for each varactor in the switched-varactor-bank 448. As can be seen from the fourth waveform 468, as the varactor-switches for each varactor are operated in turn to include the associated varactors in the VCO-circuit, the bias voltages for the varactors increase one at a time, in sequence.

To summarise, in a Phase Locked Loop the division ratio can be adopted to achieve frequency chirp with certain frequency bandwidth. It may not be desirable to extend the chirp bandwidth by increasing the VCO gain because doing so can result in phase noise degradation. One or more of the examples disclosed herein can create frequency offset/increase by using additional varactors that are enabled sequentially during the chirp ramp-up period, where the capacitance change of individual varactors is below the PLL bandwidth. Normally the PLL tune voltage would increase, however if additional capacitance is switched on (slowly) the Vtune will start to decrease, while frequency will continue increasing, such that the PLL can achieve higher bandwidth. Examples disclosed herein use this principle, where multiple varactor are used sequentially. The phase noise can be improved as more varactors (with lower gain) are sequentially switched on, resulting effectively in lower VCO gain (Kvco).

For example, suppose that the bandwidth of the output-signal ($f_O$) is desired to be doubled. If Kvco is doubled (Kvco_new=2·Kvco), then the phase noise will increase. However, if a frequency offset is implemented using a varactor bank as discussed above, then Kvco_new=Kvco+ 1/n·Kvco, if same chirp bandwidth needs to be achieved.

One or more of examples disclosed herein can be used in automobile applications, where a PLL can be used to generate a frequency chirp. The frequency chirp can be translated (after post processing) to a distance measurement in a car radar application, for example. For short range application, increased chirp-bandwidth can be desired. As discussed above, examples disclosed herein can provide an alternative way of increasing chirp-bandwidth without increasing overall Kvco.

Embodiments disclosed herein can enable several radar systems to be provided in a single car, thereby offering different functionalities that can also include lane keeping and parking assistance. The use of a radar system that is capable of covering many different applications would result in reduced production costs, especially if an associated transceiver is integrated in CMOS technology.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:
1. A chirp-generator comprising:
a phase-detector configured to:
   receive a clock-input-signal;
   receive a feedback-signal; and
   provide a phase-difference-signal representative of a phase difference between the clock-input-signal and the feedback-signal;
a voltage-controlled-oscillator that includes a VCO-circuit, wherein the VCO-circuit is configured to provide a chirp-generator-output-signal based on the phase-difference-signal, where the VCO-circuit comprises:
  a switched-varactor-bank, which includes:
    a plurality of varactors, and
    a varactor-switch associated with each of the plurality of varactors, wherein the varactor-switch is configured to selectively control whether or not the associated varactor contributes to capacitance of the VCO-circuit, based on a varactor-control-signal;
  a feedback-component configured to:
    receive the chirp-generator-output-signal; and
    apply a variable-division-factor to the chirp-generator-output-signal in order to provide the feedback signal for the phase-detector, wherein the phase-detector, the voltage-controlled-oscillator, and the feedback-component comprise a phase-locked-loop having a PLL-bandwidth and a rate of change of capacitance of the switched-varactor-bank, when it is controlled to contribute to the capacitance of the VCO-circuit, is slower than the PLL-bandwidth;
  a controller configured to:
    provide a sequence of different variable-division-factors to the feedback-component; and
    provide varactor-control-signals to the plurality of varactors such that the plurality of varactors are sequentially controlled such that they contribute to the capacitance of the VCO-circuit.

2. The chirp-generator of claim 1, wherein the sequence of the different variable-division-factors comprises a set of values that increase or decrease linearly over time.

3. The chirp-generator of claim 1, wherein the varactor-control-signals are configured to sequentially control the plurality of varactors such that each one contributes to the capacitance of the VCO-circuit in turn.

4. The chirp-generator of claim 1, wherein the varactor-control-signals are configured to sequentially control the plurality of varactors such that each one starts contributing to the capacitance of the VCO-circuit in turn, at moments in time that are evenly spaced apart during a chirp in the chirp-generator-output-signal.

5. The chirp-generator of claim 1, wherein the switched-varactor-bank further comprises:
  a varactor-biasing-circuit associated with each of the plurality of varactors, wherein each varactor-biasing-circuit comprises:
    a bias-voltage-connection configured to provide a bias voltage to the associated varactor;
    a chirp-bias-current-source;
    a chirp-reset-current-source;
    a varactor-chirp-switch configured to selectively connect the chirp-bias-current-source to the bias-voltage-connection; and
    a varactor-reset-switch configured to selectively connect the chirp-reset-current-source to the bias-voltage-connection, wherein, based on the state of the varactor-control-signal, the varactor-biasing-circuit is configured to:
      close the varactor-chirp-switch and open the varactor-reset-switch in order for the associated varactor to contribute to the capacitance of the VCO-circuit; and
      open the varactor-chirp-switch and close the varactor-reset-switch in order for the associated varactor not to contribute to the capacitance of the VCO-circuit.

6. The chirp-generator of claim 5, wherein a magnitude of the chirp-reset-current-source is greater than a magnitude of the chirp-bias-current-source.

7. The chirp-generator of claim 5, wherein each varactor-biasing-circuit further comprises:
  a low-pass filter that is connected between the bias-voltage-connection and ground.

8. The chirp-generator of claim 1, wherein the voltage-controlled-oscillator further comprises:
  a switched-coarse-bank that includes a plurality of capacitors that are either included in or excluded from the VCO-circuit based on a received coarse-control-signal.

9. The chirp-generator of claim 8, wherein the coarse-control-signal is a static signal during use, which is configured to set a capacitance level of the switched-coarse-bank.

10. The chirp-generator of claim 1, wherein each of the plurality of varactors comprises a pair of varactors.

11. The chirp-generator of claim 1, wherein the voltage-controlled-oscillator comprises a positive-VCO-output-terminal and a negative-VCO-output-terminal, either of which is configured to provide the chirp-generator-output-signal, and the switched-varactor-bank is connected between the positive-VCO-output-terminal and the negative-VCO-output-terminal.

12. The chirp-generator of claim 1, wherein the feedback-component is configured to apply an integer or fractional variable-division-factor to the chirp-generator-output-signal in order to provide the feedback signal for the phase-detector.

13. A method of operating a chirp-generator, the method comprising:
  receiving a clock-input-signal;
  receiving, in a phase detector, a feedback-signal;
  providing, with the phase detector, a phase-difference-signal representative of a phase difference between the clock-input-signal and the feedback-signal;
  providing, with a voltage-controlled-oscillator, a chirp-generator-output-signal based on the phase-difference-signal;
  selectively controlling whether or not one or more of a plurality of varactors in a switched-varactor-bank contributes to capacitance of a VCO-circuit;
  applying, with a feedback-component, a sequence of different variable-division-factors to the chirp-generator-output-signal in order to provide the feedback signal for the phase-detector, wherein the phase-detector, the voltage-controlled-oscillator, and the feedback-component comprise a phase-locked-loop having a PLL-bandwidth and a rate of change of capacitance of the switched-varactor-bank, when it is controlled to contribute to the capacitance of the VCO-circuit, is slower than the PLL-bandwidth; and
  providing varactor-control-signals to the plurality of varactors such that the varactors are sequentially controlled such that they contribute to the capacitance of the VCO-circuit.

14. An automobile system comprising the chirp-generator of claim 1.

* * * * *